US006253071B1

(12) United States Patent
Hard et al.

(10) Patent No.: US 6,253,071 B1
(45) Date of Patent: *Jun. 26, 2001

(54) METHOD AND APPARATUS FOR A CROSS-CONNECT SYSTEM WITH AUTOMATIC FACILITY INFORMATION TRANSFERENCE TO A REMOTE LOCATION

(75) Inventors: Douglas G. Hard, Fayetteville, TN (US); Bryan K. Kennedy, Madison, AL (US)

(73) Assignee: Con-X Corporation, Huntsville, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/153,899

(22) Filed: Sep. 16, 1998

Related U.S. Application Data

(63) Continuation of application No. 08/591,817, filed on Jan. 25, 1996, now Pat. No. 5,812,934, which is a continuation-in-part of application No. 08/408,831, filed on Mar. 20, 1995, now Pat. No. 6,031,349, which is a continuation-in-part of application No. 08/111,770, filed on Aug. 25, 1993, now Pat. No. 5,456,608.

(51) Int. Cl.[7] ................................................... H04M 11/00
(52) U.S. Cl. ........................... 455/404; 455/410; 455/412; 455/414; 455/31.2; 455/32.1
(58) Field of Search ................................. 455/31.2, 32.1, 455/404, 414, 415, 406, 410, 411, 412; 379/248, 245

(56) References Cited

U.S. PATENT DOCUMENTS

| | | | |
|---|---|---|---|
| 4,812,843 | * 3/1989 | Champion, III et al. | 340/905 |
| 5,163,086 | * 11/1992 | Ahearn et al. | 379/91 |
| 5,384,831 | * 1/1995 | Creswell et al. | 379/64 |
| 5,621,787 | * 4/1997 | McKoy et al. | 379/144 |
| 5,724,664 | * 3/1998 | Lantto | 455/560 |
| 5,883,943 | * 3/1999 | Siddiqui | 379/142 |

* cited by examiner

Primary Examiner—Daniel Hunter
Assistant Examiner—Yemane Woldetatios

(57) ABSTRACT

Automatic facility information transfer to remote locations in cross-connect systems is accomplished by providing limited telephone services to wired premises not having permanent telephone service by enabling 911 calls, calls requesting permanent service, operator-assisted telephone company credit card calls, and calls to repair/maintenance centers from personnel in the field. In response to off-hook conditions at prospective subscriber premises or service personnel handsets connected to cable pairs in the field, limited telephone services are provided by a matrix system. Cable pair designations and the dialed telephone number are ascertained to respectively access a database and look-up table to retrieve facility information and protocol information for subsequent transmission of the calling line telephone number and facility information to a paging system. The paging system transmits the information to the telephone company business office, emergency center, or repair/maintenance service center being dialed. Telephone company credit card calls are transferred to an operator for conventional processing. In parallel with the paging transmission, calls progress through the network with the calling line telephone number inserted into the call for display at the calling destination. A representative at the calling destination verifies calling line telephone numbers received from the paging system and displayed at a paging device against calling line telephone numbers received from the telephone network and displayed at a workstation. An alternative embodiment utilizes four wire modems to retrieve facility information from an administrative workstation for storage in the matrix system and transfer to the calling destination.

33 Claims, 5 Drawing Sheets

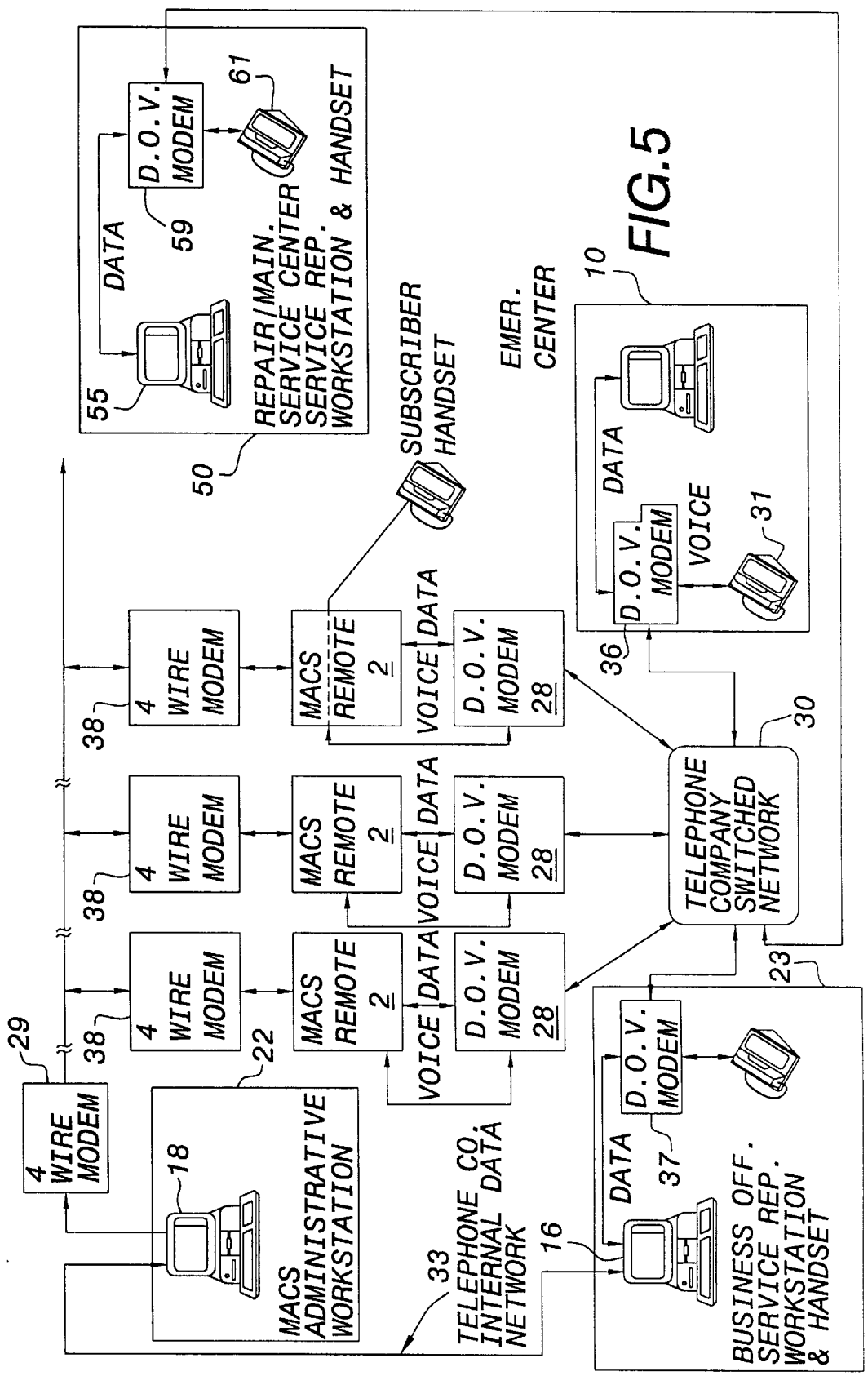

METHOD AND APPARATUS FOR A CROSS-CONNECT SYSTEM WITH AUTOMATIC FACILITY INFORMATION TRANSFERENCE TO A REMOTE LOCATION

CROSS-REFERENCE TO RELATED APPLICATIONS

This application is a continuation of U.S. patent application Ser. No. 08/591,817, entitled "Method and Apparatus for a Cross-Connect System with Automatic Facility Information Transference to a Remote Location", filed Jan. 25, 1996, now U.S. Pat. No. 5,812,934, which is a continuation-in-part of U.S. patent application Ser. No. 08/408,831, filed Mar. 20, 1995 and entitled "Cross-Connect Method and Apparatus", now U.S. Pat. No. 6,031,349, which is a continuation-in-part of U.S. patent application Ser. No. 08/111,770, filed Aug. 25, 1993 and entitled "Cross-Connect System", now U.S. Pat. No. 5,456,608. The entire disclosures in these patent applications are incorporated herein by this reference.

BACKGROUND OF THE INVENTION

1. Technical Field

The present invention relates generally to automatically controlled matrix switching and manipulation in telephone systems or the like and, more particularly, to automatic transfer of facility information associated with a caller's premises from the matrix system to a remote location requiring such information.

2. Discussion of Prior Art

In response to a request received at a prior art telephone company business office from a prospective subscriber for full and permanent telephone service, information relating to the prospective subscriber is conventionally obtained orally by a service representative. Since the prospective subscriber does not know specific facility information (i.e. facility assignment numbers for facilities serving the prospective subscriber's premises), the service representative must send an order, prepared from the request for permanent service, to other locations to obtain the required facility information in order to establish permanent service. The prior art overcame the need for obtaining facility information from other locations by leaving the cable pair, central office and line terminating card, and telephone number connected to a disconnected line of a previous subscriber, so that a new subscriber can retain the same known facility information from the previous subscriber. The association between a calling line and facility information is determined via automatic number identification (ANI) whereby the calling line telephone number (i.e., in this case the telephone number of the previous subscriber) is automatically inserted into the dial pulse stream of a call during routing of the call over telephone lines.

In order to automate servicing requests for telephone service, our copending U.S. patent application Ser. No. 08/408,831 and U.S. Pat, No. 5,456,608 disclose a cross-connect matrix and a method and apparatus for remotely placing jumper pins within the matrix to establish cross-connections between cable pairs and central office telephone lines in order to provide temporary and permanent telephone service to prospective subscribers. Also disclosed is a "soft dial tone" feature whereby a prospective subscriber at a premises lacking full telephone service but connected to a cross-connect matrix (e.g., from installation for a previous subscriber occupant of the premises) is provided with limited telephone service sufficient only to place telephone calls to an emergency center (i.e., 911 emergency center), the telephone company business office to request permanent telephone service, or other locations designated by the telephone company. Specifically, a soft or limited access dial tone line is connected to the matrix instead of to the telephone switching mainframe in order for the matrix system to selectively establish the proper connection and provide such limited service. However, neither of the aforementioned disclosures provide a way to automatically associate and verify the exact address, location and facility information of a prospective subscriber.

Further, the prior art determination of the association between facility information and the calling line telephone number has several disadvantages. The determination is ineffective if the previous subscriber transfers his/her telephone number to a new location. Further, there is no way to automatically associate and verify the exact address location and facility information of a prospective subscriber. Moreover, the service representative is required to verify the facility information by means of time consuming research of facilities and thereafter arrange for technicians from a central office to associate the calling line telephone number with the facility used to make the request for permanent service, thereby increasing time, labor and cost of the process.

OBJECTS AND SUMMARY OF THE INVENTION

Accordingly, it is an object of the present invention to provide a method and apparatus for automatically transmitting the address, facility information and other related data required to establish full and permanent service, directly and automatically, to the service representative at a telephone company business office.

It is another object of the present invention to verify an association between facilities at a prospective subscriber's premises and a subscriber calling line by automatically transmitting facility information, during a call requesting service, to a service representative at a telephone company business office to permit display of information related to the subscriber's calling line at the time the call is answered.

Yet another object of the present invention is to automatically transmit address, facility information and other relevant data to a telephone company business office, emergency center, or repair/maintenance service center to permit a plurality of service representatives to selectively receive data applicable to the call being answered.

Still another object of the present invention is to verify address and facility information by collecting, formatting and transmitting such information, along with the calling line telephone number, via a wireless telephone or paging network to an appropriate telephone company business office, emergency center, or repair/maintenance service center location for comparison with a calling line telephone number received from conventional telephone switching equipment.

A further object of the present invention is to provide a method and apparatus for identifying a specific soft dial tone line carrying either a prospective subscriber's call to a telephone company business office or an emergency center, or a service personnel member's call to a repair/maintenance service center.

Yet another object of the present invention is to provide a method and apparatus for processing telephone company credit card calls from premises not yet having telephone services enabled.

According to the present invention, automatic transfer of facility information to a remote location is accomplished by a matrix system at a remote site establishing a connection to provide limited telephone service (i.e., "soft dial tone") to a prospective subscriber or a service personnel member located in the field and connected via a handset to a cable pair whose facility information is unavailable. The matrix system also identifies the matrix x-y coordinates (i.e., the row and column within the matrix for establishing the connection are identified in substantially the same manner as described in the copending Ser. No. 08/408,831 application) associated with a connection, to a limited service cable pair, established to provide the limited telephone service to the prospective subscriber or service personnel member. The identified x-y coordinates correspond to a designation of the particular cable pair used for the connection. The identified cable pair designation can be used as a key to-access calling facility information such as the address, distribution cable pair, binding post number, cross-connection information, address of cross-connection box, feeder cable pair number, and previous subscriber telephone number, stored in a database local to the matrix system. The previous subscriber telephone number is not actually needed since the matrix system of the present invention utilizes a soft dial tone line and has an established telephone number for the soft dial tone line used for the connection. The matrix system monitors the prospective subscriber's or service personnel member's telephone activity, and when the prospective subscriber, after going off-hook and receiving "soft" dial tone, desires to make a telephone company credit card call by dialing zero, the matrix system transfers the prospective subscriber's call to an operator in order for further processing. In response to detecting dialing of a telephone number of the telephone business office, emergency center or repair/maintenance service center, the matrix system retrieves, from a local look-up table, routing and protocol information of a paging system local to the telephone company business office, emergency center or repair/maintenance service center being called. The matrix system subsequently goes off-hook via a modem to access the paging system and transfer the calling line telephone number and retrieved facility information to the paging system in order for the information to be sent to the telephone company business office, emergency center, or repair/maintenance service center. In parallel with the above transmission of information, the dialed call is routed through conventional telephone lines with the calling line telephone number inserted into the dial pulse stream of the call by telephone switching equipment via automatic number identification (ANI). In response to the call being answered at a telephone company business office, emergency center or repair/maintenance service center, the inserted calling line telephone number is displayed at a workstation screen while the facility information and calling line telephone number received from the paging system is displayed at a pager display. In order to verify the facility information, the calling line telephone numbers received via the aforementioned wireless transmission pager and conventional telephone line paths are compared. A match between the calling line telephone numbers indicates correct facility information for the call. The verified facility information may be orally communicated to the service personnel member in the field via the soft dial tone call. In addition, the matrix system may send test stimuli to the cable pair utilized by the handset to ensure proper operation of the cable pair.

Alternatively, four-wire modems may be utilized for the transmission of prospective subscriber facility information from an administration center to a matrix system at a remote location. The administration center typically includes a workstation having facility information for cable pairs and polls the matrix system to service any requests for facility information. In response to a prospective subscriber or service personnel member lifting a receiver or handset off-hook, the matrix system establishes a connection to provide limited telephone service via a data-over-voice (DOV) modem in order to enable the prospective subscriber to place a call to the business office or emergency center, while the service personnel member can place a call to the repair/maintenance service center. The matrix system further identifies the x-y coordinates (i.e., the row and column within the matrix for establishing the connection is identified in substantially the same manner as described in copending Ser. No. 08/408,831 application) within the matrix system of the connection for the call of the prospective subscriber or service personnel member, thereby identifying a particular designation for the cable pair used in the connection in the manner described above. The matrix system subsequently responds to the poll from the administration center by requesting facility information for the identified cable pair designation. The administration center retrieves the facility information based upon the identified cable pair designation, and downloads the facility information to the matrix system via four-wire modems. In response to the call being answered at the telephone company business office, emergency center or repair/maintenance service center, the facility information and voice signals of the prospective subscriber or service personnel member are respectively transmitted over the same telephone line to the screen and telephone handset of a service representative workstation via DOV modems from the matrix system. The service representative at the repair/maintenance service center orally communicates the facility information to the service personnel member in the field via the soft dial tone call. Further, the matrix system may send test stimuli to the cable pair utilized by the handset to ensure proper operation of the cable pair. Moreover, subsequent to orally ascertaining customer credit, work location, contact names, and other information from the prospective subscriber, the service representative at the business office calls the administration center to download the facility and newly retrieved information and request permanent service.

The above and still further objects, features and advantages of the present invention will become apparent upon consideration of the following detailed description of a specific embodiment thereof, particularly when taken in conjunction with the accompanying drawings wherein like reference numerals in the various figures are utilized to designate like components.

BRIEF DESCRIPTION OF THE DRAWINGS

FIG. 5 is a functional block diagram of a system utilizing four wire and data-over-voice modems to transfer facility information to a telephone company business office, emergency center, or repair/maintenance service center according to the present invention.

DESCRIPTION OF THE PREFERRED EMBODIMENTS

Figure 1:
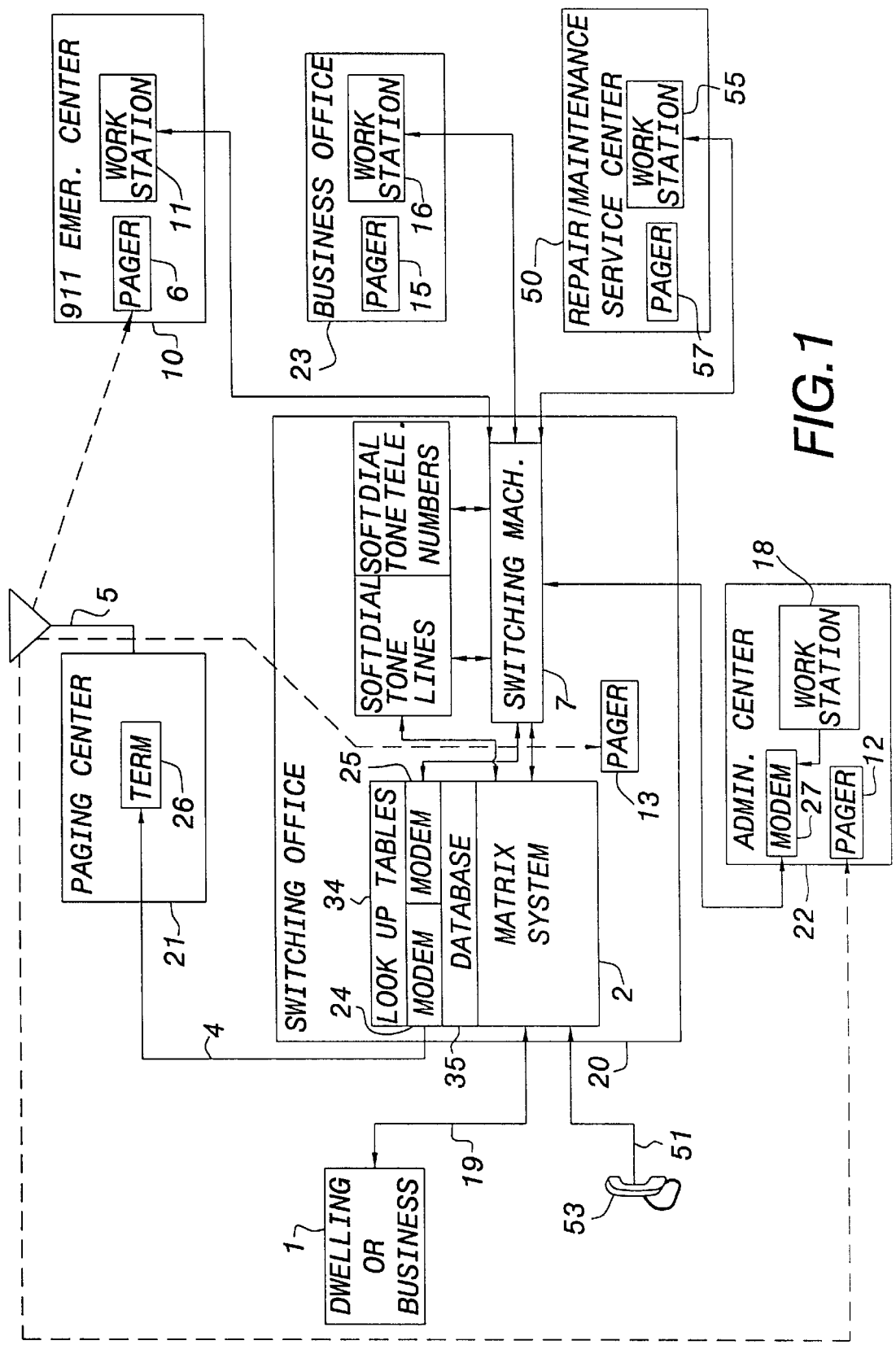
FIG. 1 is a functional block diagram of a system for processing a call from a dwelling unit to an emergency center with the calling line telephone number and facility information being automatically transferred and displayed at the emergency center according to the present invention.
Figure 2:
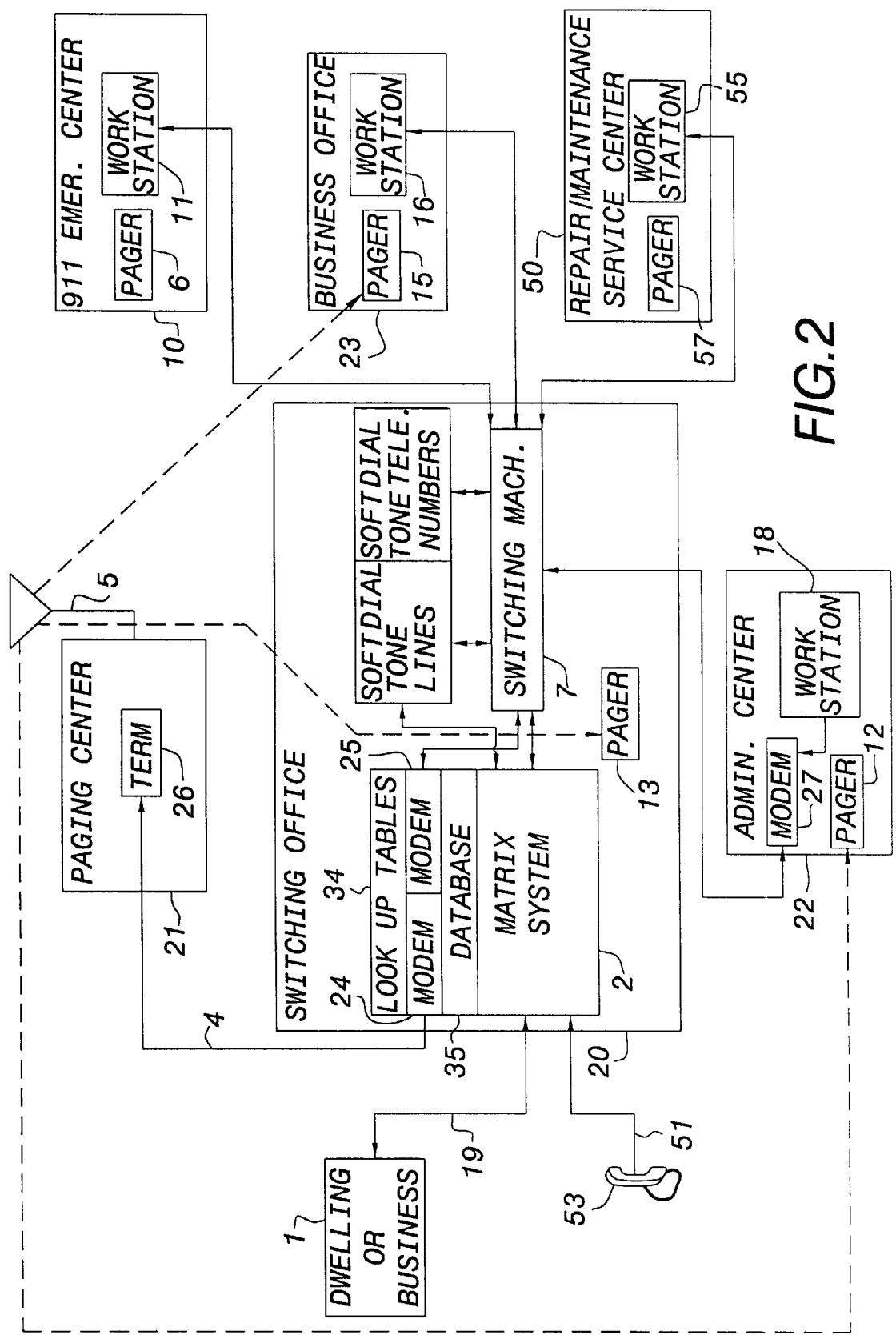
FIG. 2 is a functional block diagram of a system for processing a call from a dwelling unit to a telephone company business office with the calling line telephone number and facility information being automatically transferred and displayed at the telephone company business office according to the present invention.
Figure 3:
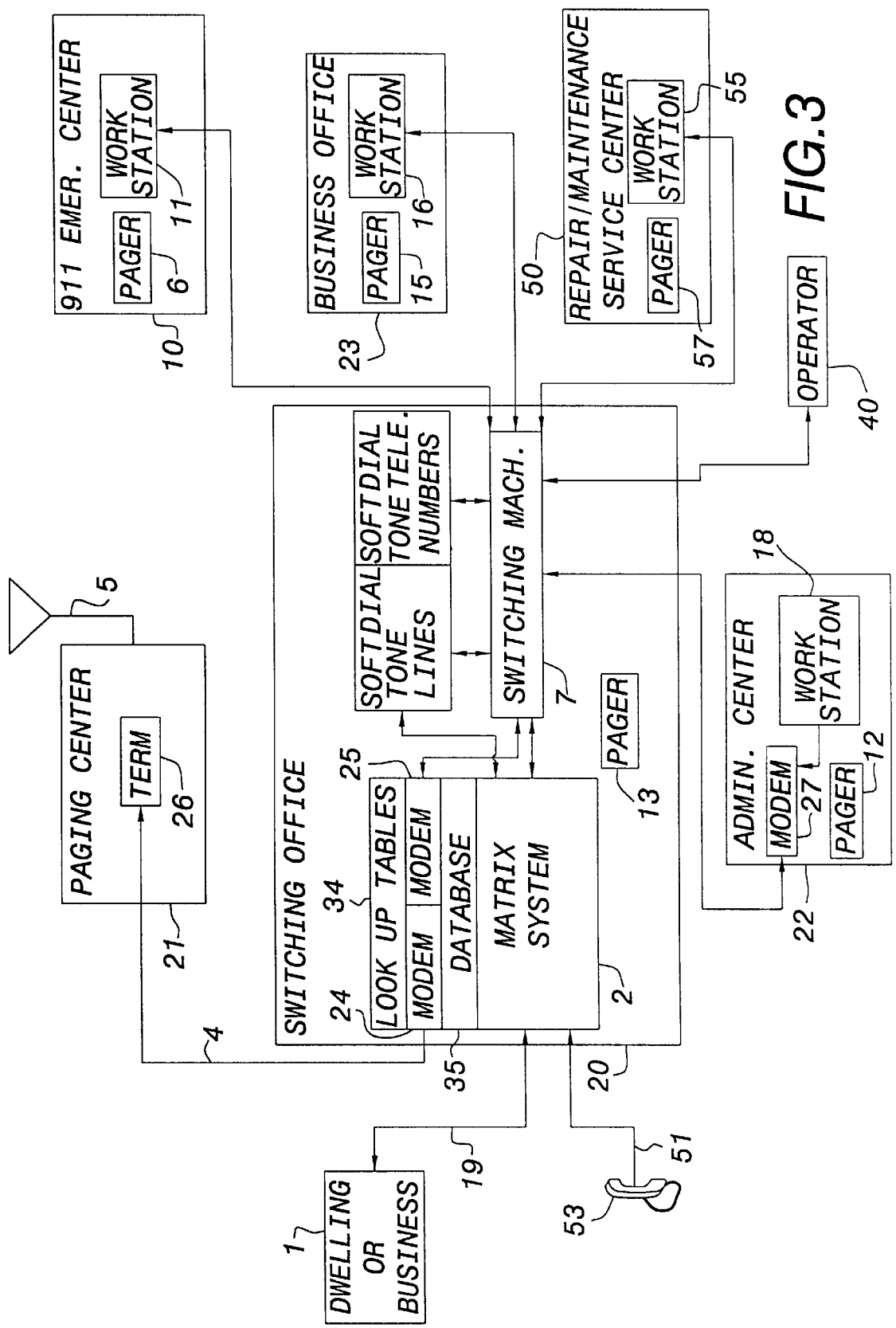
FIG. 3 is a functional block diagram of a system for processing a call from a dwelling unit to an operator in order to make a credit card call according to the present invention.
Figure 4:
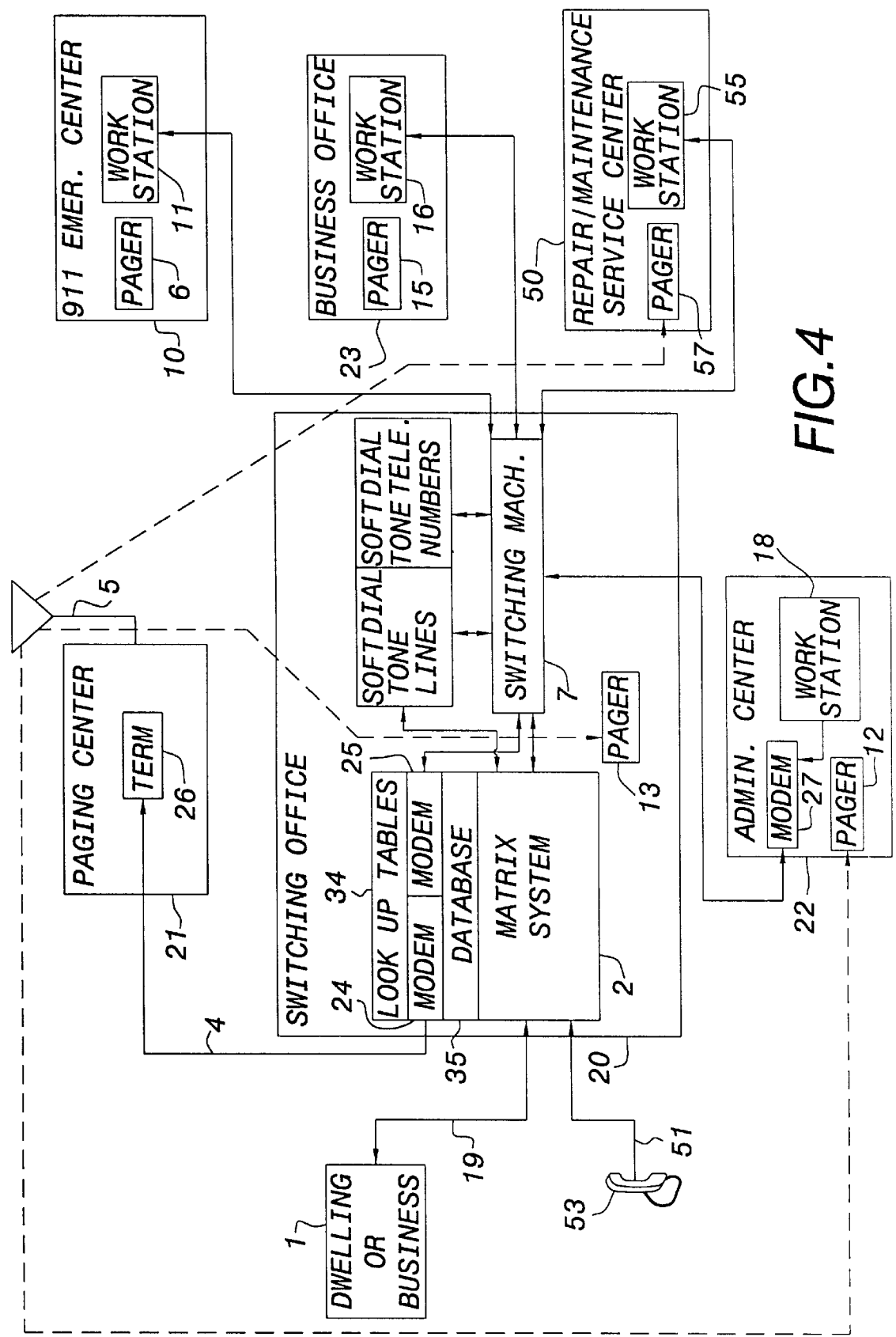
FIG. 4 is a functional block diagram of a system for processing a call from a handset, connected to a cable pair in the field whose facility information is unavailable, to a repair/maintenance service center with the calling line telephone number and facility information being automatically transferred and displayed at the repair/maintenance service center according to the present invention.

FIGS. 1–3 illustrate a system for routing a call from a non-enabled telephone line (i.e., full telephone service not enabled) at a prospective subscriber's premises to either an emergency center (e.g., 911 emergency center), a telephone company business office for requesting permanent service, or an operator to place a call by credit card. Specifically, the system includes a plurality of dwelling units or businesses 1 (only one of which is shown in the drawings), a telephone company switching office 20, a paging center 21, an emergency center 10, an administration center 22, and a telephone company business office 23. The system illustrated in FIG. 4 is substantially similar to the system of FIGS. 1–3 except that a call from a service personnel member, via a handset 53 connected to a cable pair 51 in the field whose facility information is unavailable, is routed to a repair/maintenance service center 50.

Dwelling units or businesses 1 are typically connected to switching office 20 via non-enabled telephone lines 19 (i.e., lines that are not yet connected for full telephone service) while cable pair 51 is directly connected. Switching office 20 typically includes a matrix system 2 having look-up tables 34 and database 35, as well as modems 24, 25 which communicate with paging center 21 and administration center 22, respectively. Matrix system 2 is substantially similar to, offers soft dial tone service in substantially the same manner as, and may be located at various sites external of switching office 20 in a similar fashion as, the matrix system disclosed in copending U.S. patent application Ser. No. 08/408,831 and U.S. Pat. No. 5,456,608. Switching office 20 further includes conventional telephone switching equipment 7 for routing calls to proper destinations while inserting the calling line telephone number, via automatic number identification (ANI), within the dial pulse stream of the call. Paging center 21 typically includes paging terminal 26 for receipt of data to be transmitted by transmitter 5. Emergency center 10 is typically a conventional emergency center for receipt of 911 calls and includes a workstation 11 and a corresponding pager display device 6 for use by an operator. Telephone company business office 23 is a typical business office for receiving requests from prospective subscribers desiring establishment of permanent telephone service at their premises and includes workstation 16 and corresponding pager display device 15 for use by a service representative. Repair/maintenance service center 50 is a common service center for distributing facility information and handling service requests from customers and service personnel in the field. The service center includes a workstation 55 and corresponding pager display 57 for use by a service representative. Administration center 22 oversees operation of matrix system 2 and telephone company business office 23 through communication with matrix system 2 and workstation 16 of telephone company business office 23 via modem 27 and switching equipment 7 respectively. Administration center 22 includes workstation 18 for controlling matrix system 2 to establish permanent telephone service as described in copending U.S. patent application Ser. No. 08/408,831. Administration center 22 and switching office 20 may also include respective pager display devices 12, 13 to monitor operations of the system. Further, emergency center 10, telephone company business office 23, and repair/maintenance service center 50 typically include a plurality- of workstations and corresponding pager display devices to accommodate several respective operators and/or service representatives.

FIG. 1 illustrates operation of the system to process a call from a non-working telephone line of a dwelling unit or business 1 to an emergency center 10. Initially, a prospective subscriber occupies premises for which telephone facility and address information exists and corresponds to a previous subscriber, but full telephone service is no longer enabled. A database 35 residing in matrix system 2 stores facility information from telephone company service orders utilizing cable pair designations as a key or facility identifier. Specifically, assume that the prospective subscriber at dwelling 1 desires to place a call to emergency center 10 and goes off-hook. In response to detecting the off-hook condition on telephone cable pair 19 for dwelling 1 (i.e., at the prospective subscriber premises), matrix system 2 provides a dial tone by establishing a connection to one of the soft dial tone lines connected to matrix system 2 as previously described in copending U.S. patent application Ser. No. 08/408,831. Matrix system 2 identifies the x-y coordinates (i.e. the row and column within the matrix for establishing the connection to the soft dial tone line are identified in substantially the same manner as described in the Ser. No. 08/408,831 application) within the matrix of the connection establishing the soft dial tone service in order to associate the coordinates with a particular designation of the cable pair used for the connection. The associated cable pair designation is used to retrieve facility information pertaining to the facilities at the prospective subscriber's premises from matrix system database 35 in order to store the information in a holding register (not shown). The facility information retrieved typically includes the address, distribution cable pair, binding post number, cross-connection information, address of cross-connection box, feeder cable pair number, and previous subscriber telephone (although no longer needed since the matrix system utilizes a soft dial tone line and knows the telephone number of the soft dial tone line used for the connection).

During facility information retrieval described above, matrix system 2 monitors a call placed by the prospective subscriber in order to ascertain the first digit of the telephone number being dialed. In response to an initial digit of nine being dialed, matrix system 2 is aware the call is being placed to emergency center 10 (i.e., 911 is being dialed) and immediately accesses look-up tables 34 local to matrix system 2 to retrieve routing and protocol information for a wireless or alphanumeric paging center 21 serving the area of emergency center 10. The routing and protocol information retrieved from look-up tables 34 are converted to the proper dialing protocol to route a call from modem 24 residing in matrix system 2 over a conventional telephone line 4 to paging terminal 26 at paging center 21. Modem 24 typically formats the retrieved protocols for the calling soft dial tone line telephone number (i.e., the telephone number of the soft dial tone line known by the matrix system and used for the connection to establish soft dial tone service) and address of the prospective subscriber premises for transfer to paging center 21 via conventional telephone line 4. Matrix system 2 typically goes off-hook via modem 24 to access paging terminal 26 at paging center 21 in order to send the calling soft dial tone line telephone number and address of the prospective subscriber's premises, contained in the facility information retrieved from matrix system database 35, to paging terminal 26. Transmitter 5 transmits the calling soft dial tone line telephone number and address of the prospective subscriber's premises to all wireless pager displays 6 at emergency center 10, whereby the calling soft dial tone line telephone number and address of the prospective subscriber's premises are subsequently displayed.

In parallel with the forwarding and transmission of data as described above, the call placed by the prospective subscriber progresses via the soft dial tone connection and traverses conventional telephone switching equipment. Specifically, switching equipment 7 routes the call to emergency center 10 with the calling soft dial tone line telephone number being automatically inserted into the dial pulse stream of the call, via automatic number identification (ANI), for subsequent display at all workstations 11. As the call is answered by an available operator at emergency center 10, the calling soft dial tone line telephone number from the telephone switching equipment is displayed at the operator's workstation 11 while the calling soft dial tone line telephone number and address of the prospective subscriber's premises, transmitted from paging center 21, is displayed at corresponding wireless pager display 6. The address of the prospective subscriber's premises displayed at wireless pager display 6 is associated with the incoming call displayed at the operator's workstation 11 and verified by comparing the calling soft dial tone line telephone number displayed at the operator's workstation 11 with the calling soft dial tone line telephone number displayed at corresponding wireless pager display 6. In response to a match, emergency center 10 has an exact verified address of the call as displayed at wireless pager display 6 where the call can be held until an on-hook condition is sensed over the conventional telephone lines.

As an additional service and security measure, wireless pager displays 12, 13 may be placed in administration center 22 and switching office 20 respectively, or other suitable location to enable maintenance and operations personnel to receive the transmission from paging center 21 and monitor calls. Further, administration center 22 may record events and provide documentation disclosing date, time and all other relevant details of the call.

Operation of the system to process a call from a non-enabled telephone line of a dwelling unit or business to a telephone company business office is illustrated in FIG. 2. This operation is substantially similar to processing a call to an emergency center as described above except that all facility information of the prospective subscriber's premises is transmitted to the telephone company business office via the paging center as opposed to only transmitting the calling soft dial tone line telephone number and address of the prospective subscriber's premises. Specifically, matrix system 2 detects an off-hook condition at the prospective subscriber's premises and provides a dial tone by establishing a connection to one of the soft dial tone lines as described above. Matrix system 2 typically identifies the matrix x-y coordinates (i.e.,.the row and column within the matrix for establishing the connection to the soft dial tone line are identified in substantially the same manner as described in the copending Ser. No. 08/408,831 application) for the connection establishing the soft dial tone service in order to associate those coordinates with a particular designation of the cable pair used for the connection. The associated cable pair designation is used to retrieve facility information pertaining to the facilities at the prospective subscriber's premises from matrix system database 35 as described above.

During facility information retrieval, matrix system 2 monitors a call placed by the prospective subscriber in order to ascertain the first three digits of the telephone number being dialed. In response to the first three digits being dialed, matrix system 2 is aware of the specific location of the telephone company business office being called and subsequently accesses look-up tables 34 local to matrix system 2 to retrieve routing and protocol information for a wireless or alphanumeric paging center 21 servicing the area of telephone company business office 23. The routing and protocol information retrieved from look-up tables 34 are converted to the proper dialing protocol to route a call from modem 24, residing in matrix system 2, over a conventional telephone line 4 to paging terminal 26 at paging center 21. Modem 24 typically formats the retrieved protocols for the calling soft dial tone line telephone number (i.e., the telephone number of the soft dial tone line known by the matrix system and used for the connection to establish soft dial tone service) and facility information of the prospective subscriber's premises for transfer to paging center 21 via conventional telephone line 4. Matrix system 2 typically goes off-hook via modem 24 to access paging terminal 26 in order to outpulse (i.e., send) the calling soft dial tone line telephone number and facility information of the prospective subscriber's premises retrieved from matrix system database 35 to paging terminal 26 for transmission by transmitter 5 to all wireless pager displays 15 at telephone company business office 23.

In parallel with the forwarding and transmission of data as described above, the call placed by the prospective subscriber progresses via the soft dial tone connection and traverses switching equipment 7 where the call is routed to telephone company business office 23. The calling soft dial tone line telephone number is automatically inserted into the dial pulse stream of the call via automatic number identification (ANI) for subsequent display on all workstations 16. In response to an available service representative answering the call at telephone company business office 23, the calling soft dial tone line telephone number from the telephone switching equipment is displayed at the service representative's workstation 16 while the calling soft dial tone line telephone number and facility information transmitted from paging center 21 is received and displayed at corresponding wireless pager display 15. The facility information for the prospective subscriber's premises is verified by comparing the calling soft dial tone line telephone number displayed at the service representative's workstation 16 with the calling soft dial tone line telephone number displayed at corresponding wireless pager display 15. A match between the displayed calling soft dial tone line telephone numbers associates the facility information displayed at wireless pager display 15 with the incoming call displayed at the service representative's workstation 16 and verifies the correctness of the facility information so that the service representative may establish permanent service.

Operation of the system to facilitate telephone company credit card calls is illustrated in FIG. 3 and is substantially similar to the processing of calls to the emergency center and telephone company business office as described above. Initially, a prospective or current subscriber obtains a credit card from the telephone company in order to place telephone calls from any location. Specifically, matrix system 2 detects an off-hook condition at the prospective subscriber premises or other location lacking full telephone services (i.e., telephone service not yet enabled) and establishes a connection to provide soft dial tone service as described above. Matrix system 2 monitors a call placed by the prospective or current subscriber in possession of a telephone company credit card to ascertain the first digit of the telephone number being dialed. In response to the first dialed digit being a zero, telephone switching equipment 7 routes the call to operator 40 to handle the call in a conventional manner for telephone company credit card calls.

Operation of the system to process a call from a handset, connected to a cable pair in the field whose facility information is unavailable, to a repair/maintenance service center is illustrated in FIG. 4. This operation is substantially similar to processing a call to a telephone company business office as described above. Initially, a service technician or personnel member on call in the field may need facility information pertaining to a particular cable pair being serviced. The technician typically connects a conventional handset 53 (i.e., handsets typically used by repair/maintenance personnel in the field to connect to, and inspect, telephone line connections) to cable pair 51 and proceeds to place a call to a repair/maintenance service center 50 to request facility information relating to the cable pair. Specifically, matrix system 2 detects an off-hook condition at cable pair 51 and provides a dial tone to handset 53 by establishing a connection to one of the soft dial tone lines as described above. Matrix system 2 typically identifies the matrix x-y coordinates (i.e., the row and column within the matrix for establishing the connection to the soft dial tone line are identified in substantially the same manner as described in copending Ser. No. 08/408,831 application) for the connection establishing the soft dial tone service in order to associate those coordinates with a particular designation of the cable pair used for the connection. The associated cable pair designation is used to retrieve facility information pertaining to cable pair 51 from matrix system database 35 as described above.

During facility information retrieval, matrix system 2 monitors a call placed by the service technician in order to ascertain the first three digits of the telephone number being dialed. In response to the first three digits being dialed, matrix system 2 is aware of the specific location of the repair/maintenance service center being called and subsequently accesses look-up tables 34 local to matrix system 2 to retrieve routing and protocol information for a wireless or alphanumeric paging center 21 servicing the area of repair/maintenance service center 50. The routing and protocol information retrieved from look-up tables 34 are converted to the proper dialing protocol to route a call from modem 24, residing in matrix system 2, over a conventional telephone line 4 to paging terminal 26 at paging center 21. Modem 24 typically formats the retrieved protocols for the calling soft dial tone line telephone number (i.e., the telephone number of the soft dial tone line known by the matrix system and used for the connection to establish soft dial tone service) and facility information of cable pair 51 for transfer to paging center 21 via conventional telephone line 4. Matrix system 2 typically goes off-hook via modem 24 to access paging terminal 26 in order to outpulse (i.e., send) the calling soft dial tone line telephone number and facility information of cable pair 51 retrieved from matrix system database 35 to paging terminal 26 for transmission by transmitter 5 to all wireless pager displays 57 at repair/maintenance service center 50.

In parallel with the forwarding and transmission of data as described above, the call placed by the service technician progresses via the soft dial tone connection and traverses switching equipment 7 where the call is routed to repair/maintenance service center 50. The calling soft dial tone line telephone number is automatically inserted into the dial pulse stream of the call via automatic number identification (ANI) for subsequent display on all workstations 55. In response to an available service representative answering the call at repair/maintenance service center 50, the calling soft dial tone line telephone number from the telephone switching equipment is displayed at the service representative's workstation 55 while the calling soft dial tone line telephone number and facility information transmitted from paging center 21 is received and displayed at corresponding wireless pager display 57. The facility information for cable pair 51 is verified by comparing the calling soft dial tone line telephone number displayed at the service representative's workstation 55 with the calling soft dial tone line telephone number displayed at corresponding wireless pager display 57. A match between the displayed calling soft dial tone line telephone numbers associates the facility information displayed at wireless pager display 57 with the incoming call displayed at the service representative's workstation 55 and verifies the correctness of the facility information so that the service representative may orally communicate the facility information via the soft dial tone call to the service technician in the field. Further, matrix system 2, upon request of the service technician, may also enable test stimuli to be sent to cable pair 51 in a substantially similar manner as described in application Ser. No. 08/408,831 to test and ensure proper operation of the cable pair. The test stimuli may include various tones or other electrical signals testing various aspects of the cable pair.

An alternative mode of data transference for use as a backup system or as additional security is illustrated in FIG. 5. Specifically, four-wire modems 29, 38 respectively reside adjacent administrative center 22, and each matrix system 2 at a remote location. Administrative center 22 and each matrix system 2 are substantially similar to the administrative center and matrix system as described above. Matrix system 2 typically communicates with telephone company business office 23, emergency center 10, and repair/maintenance service center 50 via data-over-voice (DOV) modems 28 connected to a conventional telephone switching network 30 wherein voice signals and data can be sent simultaneously over the same telephone line. Emergency center 10, telephone company business office 23, and repair/maintenance service center 50 typically include respective DOV modems 36, 37, 59 and respective workstations 11, 16, 55 and are substantially similar to the emergency center, telephone company business office and repair/maintenance service center described above.

Operation of the alternative mode is now described. Specifically, matrix system 2 detects an off-hook condition at the prospective subscriber premises or a handset of a service personnel member connected to a cable pair in the field whose facility information is unavailable, and establishes a connection in substantially the same manner described in application Ser. No. 08/408,831 in order to provide limited telephone service to the prospective subscriber or service personnel member via DOV modem 28. Matrix system 2 identifies the x-y coordinates (i.e., the row and column within the matrix for the connection providing limited telephone service are identified in substantially the same manner described in the Ser. No. 08/408,831 application) within the matrix for the connection establishing limited telephone service in order to associate the coordinates with a particular designation of the cable pair used for the connection. Facility information for the prospective subscriber's premises and cable pairs in the field is stored at workstation 18 of administration center 22 utilizing cable pair designations as identification keys. Workstation 18 continually polls matrix system 2 for requests for facility information. In response to identifying the cable pair designation for the prospective subscriber's premises or cable pair utilized by the handset, matrix system 2 responds to the poll of workstation 18 and requests facility information for the identified cable pair designation. The facility information is subsequently retrieved based on the identified cable pair designation, and downloaded via four-wire modems 29, 38 to matrix system 2 for storage in a memory device or holding register (not shown). In response to answering a call at a telephone company business office 23, emergency center 10 or repair/maintenance service center 50, an off-hook condition signals matrix system 2 to send the stored facility information to the respective destination. Matrix system 2 typically inserts the appropriate facility information (i.e., only calling soft dial tone line telephone number and address for calls to emergency center 10) on the same line on which voice signals are being sent such that the voice signals and facility information are sent simultaneously over the same telephone line via DOV modem 28 and switching network 30. The facility information and voice signals are partitioned by DOV modems 36, 37, 59 at respective destinations such that the facility information is displayed at respective workstations 11, 16, 55 of emergency center 10, telephone company business office 23, and repair/maintenance service center 50 while voice signals are received by corresponding conventional handsets 31, 39, 61. In response to telephone company business office 23 receiving facility information of a prospective subscriber's premises, credit and contact information is subsequently verbally retrieved from the prospective subscriber and downloaded with the facility information to workstation 18 via an internal data network 33. An operator at administration center 22 is then instructed to establish permanent service via matrix system 2 as described in application Ser. No. 08/408,831. Further, in response to repair/maintenance service center 50 receiving facility information of the cable pair in the field, the facility information is orally communicated via the soft dial tone call to the service personnel member in the field. Moreover, matrix system 2, upon request, may ensure proper operation of the cable pair by enabling test stimuli to be sent to the cable pair as described above.

It will be appreciated that the embodiments described above and illustrated in the drawings represent only a few of the many ways of implementing a method and apparatus for a cross-connect system with facility information transference to a remote location. For example, the telephone lines may be any of the conventional telephone lines commonly used by telephone companies, or any other transmission medium capable of conveying voice and data signals. The paging devices may be any commercially available wireless it, communication devices or any other device capable of wireless communication and display. The workstations may be any commercially available computers, processors, terminals, monitors or other devices capable of displaying, processing and receiving data. The switching equipment may be any conventional switching equipment used by telephone companies or any other device capable of routing telephone calls to proper locations to achieve the results herein described. The modems may be any commercially available modems or other device capable of data transmission or data-over-voice transmission.

The present invention may also be utilized to route calls and send corresponding information to other specific individuals or locations to commence substantially any type of transaction. The data transferred may be any data necessary to a particular application employing the present invention. The database and look-up tables may be any commercially available database or memory or any other device capable of data retrieval and storage.

From the foregoing description it will be appreciated that the invention makes available a novel method and apparatus for a cross-connect system with automatic facility information transference to a remote location wherein facility information pertaining to a prospective subscriber's premises or cable pair in the field is automatically transferred to a telephone company business office, an emergency center, or a repair/maintenance service center via a wireless communication or paging system.

Having described the preferred embodiments of a new and improved method and apparatus for a cross-connect system with automatic facility information transference to a remote location, it is believed that other modifications, variations and changes will be suggested to those skilled in the art and in view of the teachings set forth herein. It is therefore to be understood that all such variations; modifications and changes are believed to fall within the scope of the present invention as defined by the appended claims.

What is claimed is:

1. An apparatus for automatically retrieving and transferring facility information of a premises of a caller lacking telephone service to a destination of a call comprising:
    a matrix system including:
        an interconnection matrix for establishing connections with cable pairs associated with said premises in order to provide limited telephone service to said caller;
        a memory for storing said facility information; and
        a recognition device to recognize an off-hook condition at said premises;
    an administration system to store facility information and to poll said matrix system for requests for said facility information;
    a first four wire modem coupled to said matrix system for downloading facility information from said administration system into said memory;
    a second four wire modem coupled to said administration system for downloading said facility information from said administration system to said matrix system;
    a switched telephone network for routing said calls to said destination;
    a matrix data-over-voice modem for inserting said facility information on the same line as voice signals of said caller to simultaneously send said voice signals and said facility information via said switched network to said destination;
    a destination data-over-voice modern at said destination for receiving and separating said facility information and said voice signals;
    a destination display at said destination to display said facility information received by said destination data-over-voice modem; and
    a destination receiver to receive and convey said voice signals received by said destination data-over-voice modem.

2. The apparatus of claim 1 wherein said matrix system further includes:
    a coordinate determining unit to determine the coordinates within the interconnection matrix corresponding to the connection of the caller;

an association device to associate said coordinates to a cable pair designation corresponding to the cable pair used in said connection; and a request unit to request said facility information from said administration system based on said cable pair designation and in response to said polling.

3. The apparatus of claim 1 wherein said destination is a 9-1-1 emergency center and said facility information comprises an address of said premises.

4. The apparatus of claim 1 wherein said destination is a telephone company business office.

5. The apparatus of claim 1 wherein said premises is a cable pair located in the field and said destination is a repair/maintenance service center, wherein said matrix system further includes a test unit to selectively test said cable pair by enabling test signals to be sent to said cable pair.

6. The apparatus of claim 4 wherein said apparatus further comprises a matrix controller to control said matrix system to establish permanent telephone service to said caller in response to a request and information retrieved from said caller, and downloading said information retrieved from said caller to said administration system.

7. A method for automatically retrieving and transferring facility information of a premises of a caller lacking telephone services to a destination of a call comprising the steps of:

(a) recognizing an off-hook condition and providing limited telephone services at said premises to permit calls to predetermined locations;

(b) retrieving facility information associated with said premises from an administration center;

(c) inserting said facility information into voice signals of said caller in order to simultaneously send said voice signals and said facility information to said destination via a first data-over-voice modem;

(d) receiving and separating said voice signals and said facility information at said destination via a second data-over-voice modem; and (e) displaying said facility information on a display device and conveying said voice signals over a handset at said destination.

8. The method of claim herein:

step (a) further includes:

(a.1) establishing a connection to a cable pair associated with the premises of the caller in order to provide said limited telephone services;

(a.2) determining a cable pair designation of the cable pair associated with the premises of the caller and used to establish said connection; and step (b) further includes requesting facility information from said administration center based on said cable pair designation and downloading said facility information from said administration center into a memory.

9. The method of claim 7 wherein said destination is a 9-1-1 emergency center and said facility information comprises an address of said premises.

10. The method of claim 7 wherein said destination is a telephone company business office.

11. The method of claim 7 wherein said premises is a cable pair located in the field and said destination is a repair/maintenance service center, wherein said method further includes the steps of:

(f) communicating said facility information to a service technician located at said cable pair; and (g) selectively testing said cable pair by enabling test signals to be sent to said cable pair.

12. The method of claim 10 further including the step of:

(f) establishing permanent telephone service at said premises in response to a request by said caller and receipt of said facility information at said telephone company business office.

13. The method of claim 12 further including the step of:

(g) downloading s aid facility information and information retrieved from said caller to said a administration center.

14. An apparatus for processing telephone company credit card calls of a caller having a telephone company credit card from premises not yet having telephone services enabled comprising:

a matrix system including:

an interconnection matrix for establishing connections with cable pairs associated with said premises in order to provide limited telephone service to said caller;

a monitor device to ascertain digits of a telephone number dialed by said caller in response to providing said limited telephone service;

a recognition device to recognize an off-hook condition at said premises; and a soft dial tone device to provide said limited telephone service at said premises to permit calls to predetermined locations in response to an off-hook condition being recognized at said premises;

a switching device to route said call to an operator to process said telephone company credit call in response to said caller dialing zero.

15. A method for processing telephone company credit card calls of a caller having a telephone company credit card from a premises not yet having telephone services enabled comprising the steps of:

(a) recognizing an off-hook condition and providing limited telephone services at said premises to permit calls to a limited number of predetermined locations;

(b) ascertaining digits of a telephone number dialed in order to place a call at said premises in response to providing said limited telephone services;

(c) routing said call to an operator to process said telephone company credit card call in response to said caller dialing a zero.

16. An apparatus for verifying telephone facility information of a premises of a caller lacking telephone service by automatically transferring a calling line telephone number via two separate paths to a destination of a call comprising:

a matrix system including:

an interconnection matrix for establishing connections between cable pairs associated with said premises in order to provide limited telephone service to said caller;

a database for storing said telephone facility information;

a look-up table for storing routing and protocol information;

a modem for transferring said calling line telephone number and facility information over a telephone line utilizing said routing and protocol information;

a recognition device to recognize an off-hook condition at said premises; and a soft dial tone device to provide said limited telephone service at said premises to permit calls to predetermined locations in response to an off-hook condition being recognized at said premises;

a switching device to route said call to said destination and insert said calling line telephone number into said call during said routing;

a paging system to receive said facility information and said calling line telephone number from said matrix system via said modem and to transmit said facility information and said calling line telephone number to said destination;

a pager display at said destination to receive and display said facility information and said calling line telephone number transmitted by said paging system; and a call display to receive and display said calling line telephone number from said switching device at said destination in response to answering said call at said destination;

wherein said calling line telephone number displayed on said pager display and said calling line telephone number displayed on said call display are displayed simultaneously to verify said facility information at said destination where a match of said calling line telephone numbers indicates proper facility information of said premises of the caller.

17. The apparatus of claim 16 wherein said matrix system further includes:

a coordinate determining unit to determine the coordinates within the interconnection matrix corresponding to the connection of the caller;

an association device to associate said coordinates to a cable pair designation corresponding to the cable pair used in said connection; and an access unit to access said facility information in said database based on said cable pair designation.

18. The apparatus of claim 17 wherein said matrix system further includes:

a monitor device to ascertain the digits of a telephone number dialed by said caller in response to providing said limited telephone service;

a look-up module to access said look-up table in response to ascertaining said digits in order to retrieve said routing and protocol information for said modem and establish a path to transfer said calling line telephone number and said facility information to said paging system.

19. The apparatus of claim 16 wherein said destination is a 9-1-1 emergency center and said facility information comprises an address of said premises.

20. The apparatus of claim 16 wherein said destination is a telephone company business office.

21. The apparatus of claim 16 wherein said premises is a cable pair located in the field and said destination is a repair/maintenance service center, wherein said matrix system further includes a test unit to selectively test said cable pair by enabling test signals to be sent to said cable pair.

22. The apparatus of claim 16 wherein said modem formats said protocol information for said calling line telephone number and said facility information in order to dial said paging system and transmit said calling line telephone number and said facility information to said paging system.

23. The apparatus of claim 20 wherein said apparatus further comprises a matrix controller to control said matrix system to establish permanent telephone service to said caller in response to a request by said caller and verification of said facility information.

24. The apparatus of claim 16 wherein a plurality of call displays and pager displays reside at said destination and said calling line telephone number associates said facility information displayed on a pager display with the calling line telephone number of an incoming call displayed on a call display.

25. A method for verifying facility information of a premises of a caller lacking telephone service by automatically transferring a calling line telephone number via two separate paths and said facility information to a destination of a call, said method comprising the steps of:

(a) recognizing an off-hook condition and providing limited telephone services at said premises to permit calls to predetermined locations;

(b) ascertaining digits of a telephone number dialed in order to place a call at said premises in response to providing said limited telephone services;

(c) retrieving said calling line telephone number and said facility information respectively associated with said call and said premises;

(d) transferring said calling line telephone number and said facility information to a paging system to transmit said calling line telephone number and said facility information to said destination;

(e) routing said call to said destination through a telephone system wherein said telephone system automatically inserts said calling line telephone number into said call during traversal of switching equipment;

(f) receiving and displaying said calling line telephone number and facility information from said paging system on a paging device at said destination;

(g) receiving and displaying said calling line telephone number from said telephone system on a display device at said destination;

(h) verifying said calling line telephone number displayed on said display device against said calling line telephone number displayed on said paging device wherein a match of said calling line telephone numbers indicates proper facility information of said premises of the caller.

26. The method of claim 23 wherein:

step (a) further includes:

(a.1) establishing a connection to a cable pair associated with the premises of the caller in order to provide said limited telephone services;

(a.2) determining a cable pair designation of the cable pair associated with the premises of the caller and used to establish said connection; and step (c) further includes retrieving said facility information from a database based on said cable pair designation of the caller.

27. The method of claim 26 wherein step (d) further includes retrieving routing and protocol information from a look-up table to establish a path via a modem for transferring said calling line telephone number and said facility information to said paging system.

28. The method of claim 25 wherein said destination is a 9-1-1 emergency center and said facility information comprises an address of said premises.

29. The method of claim 25 wherein said destination is a telephone company business office.

30. The method of claim 25 wherein said premises is a cable pair located in the field and said destination is a repair/maintenance service center, wherein said method further comprises the steps of:

(i) communicating said facility information to a service technician located at said cable pair; and (j) selectively testing said cable pair by enabling test signals to be send to said cable pair.

31. The method of claim 25 wherein step (d) further includes formatting said protocol information for said calling line telephone number and said facility information in order to access said paging system and transfer said calling line telephone number and said facility information over telephone lines via a modem.

32. The method of claim 29 further including the step of:
(i) establishing permanent telephone service at said premises in response to a request by said caller and verification of said facility information.

33. The method of claim 25 wherein step (g) further includes associating said facilities information displayed on said paging device with the calling line telephone number of an incoming call displayed on said display device by matching said calling line telephone number displayed on said display device to the calling line telephone number displayed on the paging device.

* * * * *